(12) United States Patent
Kierse et al.

(10) Patent No.: US 8,766,186 B2
(45) Date of Patent: Jul. 1, 2014

(54) CONTROL APERTURE FOR AN IR SENSOR

(75) Inventors: Oliver Kierse, Killaloe (IE); Eamon Hynes, Raheen (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/004,780

(22) Filed: Dec. 21, 2007

(65) Prior Publication Data

US 2008/0164415 A1 Jul. 10, 2008

Related U.S. Application Data

(60) Provisional application No. 60/877,305, filed on Dec. 27, 2006.

(51) Int. Cl.
*G01J 5/04* (2006.01)
*G01J 5/20* (2006.01)

(52) U.S. Cl.
USPC ............. 250/338.1; 250/239; 250/338.4

(58) Field of Classification Search
USPC .............. 257/435, 431, 434, 433, 432; 250/338.4, 370.14, 353, 352, 239, 250/338.1

See application file for complete search history.

(56) References Cited

U.S. PATENT DOCUMENTS

| | | | | |
|---|---|---|---|---|
| 4,760,440 A | * | 7/1988 | Bigler et al. | 257/680 |
| 4,994,664 A | * | 2/1991 | Veldkamp | 250/216 |
| 5,701,008 A | * | 12/1997 | Ray et al. | 250/352 |
| 5,753,857 A | | 5/1998 | Choi | 174/52.4 |
| 5,869,883 A | | 2/1999 | Mehringer et al. | 257/667 |
| 6,236,046 B1 | | 5/2001 | Watabe et al. | |
| 6,376,769 B1 | | 4/2002 | Chung | 174/52.2 |
| 6,465,786 B1 | * | 10/2002 | Rhodes | 250/338.4 |
| 6,751,420 B1 | | 6/2004 | Kienzle et al. | 398/135 |
| 6,844,606 B2 | * | 1/2005 | Logsdon et al. | 257/434 |
| 6,879,035 B2 | | 4/2005 | Syllaios et al. | 257/704 |
| 7,329,871 B2 | * | 2/2008 | Fan et al. | 250/353 |
| 7,855,100 B2 | * | 12/2010 | Shim et al. | 438/107 |

(Continued)

FOREIGN PATENT DOCUMENTS

| | | | | |
|---|---|---|---|---|
| DE | 10 2004 031 315 A1 | 1/2006 | | G01J 5/12 |
| EP | 0 453 372 A1 | 10/1991 | | G01J 5/20 |

(Continued)

OTHER PUBLICATIONS

JP-06-249708 — English Translation of Ref. AD.

(Continued)

*Primary Examiner* — David Porta
*Assistant Examiner* — Yara B Green
(74) *Attorney, Agent, or Firm* — Sunstein Kann Murphy & Timbers LLP

(57) ABSTRACT

A control aperture for an IR sensor includes a die; an IR sensor disposed on the die and an IR opaque aperture layer on the die having an IR transmissive aperture aligned with the IR sensor for controlling the field of view and focus of the IR sensor.

3 Claims, 6 Drawing Sheets

(56) References Cited

U.S. PATENT DOCUMENTS

| | | | |
|---|---|---|---|
| 2003/0128813 A1* | 7/2003 | Appleby et al. | 378/147 |
| 2004/0077118 A1 | 4/2004 | Prior | 438/51 |
| 2004/0077139 A1* | 4/2004 | Silverbrook | 438/202 |
| 2006/0016995 A1 | 1/2006 | Kummer et al. | 250/338.1 |
| 2006/0033833 A1 | 2/2006 | Hurwitz et al. | |
| 2006/0061889 A1* | 3/2006 | Tan et al. | 359/820 |
| 2006/0118721 A1 | 6/2006 | Antoszewski et al. | 250/338.4 |
| 2006/0163453 A1 | 7/2006 | Hynes et al. | |
| 2006/0266938 A1 | 11/2006 | Abela | 250/239 |
| 2007/0108635 A1* | 5/2007 | Youn | 257/787 |
| 2007/0166867 A1* | 7/2007 | Chow et al. | 438/65 |
| 2007/0272993 A1 | 11/2007 | Haag et al. | 257/434 |
| 2007/0292982 A1* | 12/2007 | Holloway et al. | 438/64 |
| 2008/0061237 A1 | 3/2008 | Franz et al. | 250/339.01 |

FOREIGN PATENT DOCUMENTS

| | | | |
|---|---|---|---|
| EP | 0664554 B1 | 7/1995 | |
| EP | 0 664 554 B1 | 12/1998 | H01J 5/20 |
| JP | 03210437 | 9/1991 | G01J 5/02 |
| JP | 06-249708 | 9/1994 | G01J 1/02 |

OTHER PUBLICATIONS

Office Action dated Dec. 8, 2008, U.S. Appl. No. 11/436,245, filed May 18, 2006.
Authorized Officer: Blaine R. Copenheaver, International Search Report, and Written Opinion of the International Searching Authority, PCT/US06/36666, May 25, 2007.
Authorized Officer: Simin Baharlou, International Preliminary Report on Patentability, PCT/US06/36666, Mar. 26, 2008.
Authorized Officer: Blaine R. Copenheaver, International Search Report, and Written Opinion of the International Searching Authority, PCT/US2007/026253, May 23, 2008.
Authorized Officer: Yoshiko Kurahawa, International Preliminary Report on Patentability, PCT/US2007/026253, Jun. 30, 2009.
Examiner Malevic, Djura, Office Action dated Jul. 23, 2009 in U.S. Appl. No. 11/436,245.
Examiner Jérôme Jacquin, Supplementary European Search Report, Application No. EP 07 86 3227, 8 pages, Apr. 24, 2012.

* cited by examiner

CONTROL APERTURE FOR AN IR SENSOR

RELATED APPLICATIONS

This application claims benefit of and priority to U.S. Provisional Application Ser. No. 60/877,305 filed Dec. 27, 2006 incorporated herein by this reference.

FIELD OF THE INVENTION

This invention relates to an improved, integral control aperture for an IR sensor.

BACKGROUND OF THE INVENTION

Generally, infra-red (IR) sensors employ a metal can containing a silicon chip containing the IR sensor. There is a hole in the can which defines the IR aperture and the hole is typically sealed with a silicon window transparent to IR wavelengths. These tend to be expensive, large and cumbersome units, which can suffer from alignment issues and are limited in the types of mountings with which they can be used.

BRIEF SUMMARY OF THE INVENTION

It is therefore an object of this invention to provide an improved integral control aperture for an IR sensor.

It is a further object of this invention to provide such an improved integral control aperture for an IR sensor which can be manufactured using existing package structure, materials and techniques.

It is a further object of this invention to provide such an improved integral control aperture for an IR sensor in which the spot:distance ratio can be better controlled.

It is a further object of this invention to provide such an improved integral control aperture for an IR sensor in which the control aperture can be on either side of the die.

It is a further object of this invention to provide such an improved integral control aperture for an IR sensor which the control aperture layer provides protection for micro etched focusing elements.

It is a further object of this invention to provide such an improved integral control aperture for an IR sensor which provides increased accuracy in aligning the control aperture with the IR sensor.

It is a further object of this invention to provide such an improved integral control aperture for an IR sensor which can be achieved on even smaller package parts, e.g. bumped packages.

It is a further object of this invention to provide such an improved integral control aperture for an IR sensor which permits mounting on a ported mounting plane, e.g. circuit board.

The invention results from the realization that an improved integral control aperture for an IR sensor which better controls the spot:distance ratio can be fabricated using existing structure, materials, and techniques. This can be achieved with an IR sensor mounted on a die and an IR opaque aperture layer on or proximate to the die having an IR transmissive aperture aligned with the IR sensor for controlling the field of view and focus of the IR sensor.

The subject invention, however, in other embodiments, need not achieve all these objectives and the claims hereof should not be limited to structures or methods capable of achieving these objectives.

This invention features a control aperture for an IR sensor including a die and an IR sensor disposed on the die. An IR opaque aperture layer on the die has an IR transmissive aperture aligned with the IR sensor for controlling the field of view and focus of the IR sensor.

In a preferred embodiment the IR may be on one side of the die and the aperture layer may be on the other and the die is transparent to IR. The aperture layer may include a paddle bonded to the die. The aperture layer may include a copper alloy material. The die may include a base supporting the IR sensor and a cap covering the IR sensor. The die and paddle may be mounted in a molded package. The die may include silicon. The aperture layer may include an IR opaque coating bonded to the die. The die may include solder bumps. The solder bumps may be on the side opposite the aperture layer. The aperture layer may be on the cap portion of the die covering the IR sensor on one side of the base of the die and the solder bumps may be on the other side of the die. The IR sensor may be on one side of the base of the die covered by the cap and the aperture layer may be on the other side of the die which contains solder bumps. The IR sensor may be on one side of the base of the die covered by the cap and the aperture layer may include a laminated layer bonded to the die on the other side from IR sensor. The laminate may carry solder bumps. The die may be disposed in a mold which together with the laminate layer forms a laminate package. The die may be disposed in a mold which constitutes the aperture layer on the cap portion of the die. The other side of the die may be supported by a lead frame. The die may be disposed in the mold which exposes at least a portion of the cap and the aperture layer may be disposed on the cap. The other side of the die may be supported by a lead frame. There may be a coating on the other side of the die.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
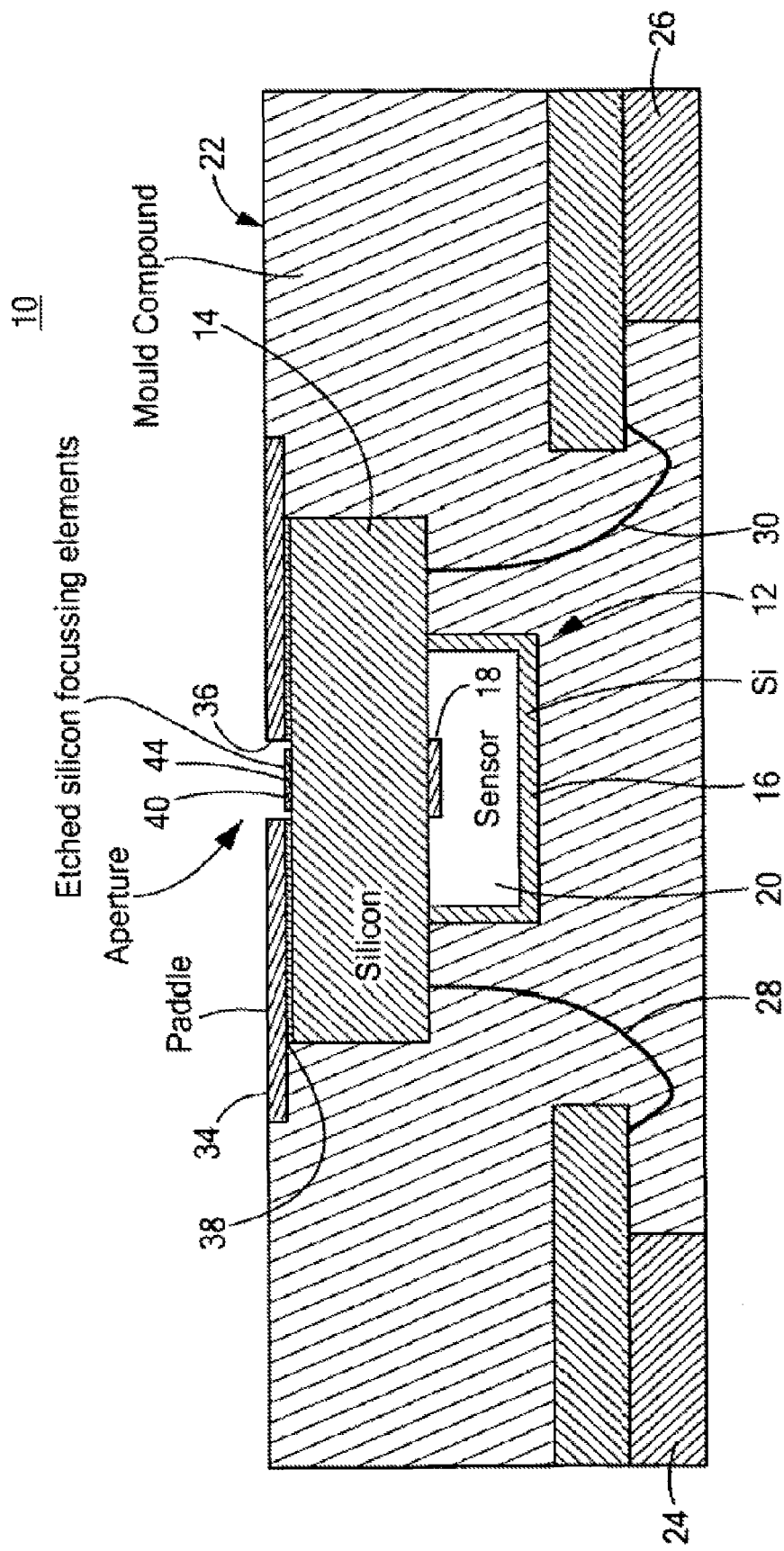
FIG. 1 is a schematic side sectional view of the control aperture for an IR sensor according to this invention in an exposed paddle package.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 an exposed paddle lead frame package 10 including a silicon die 12 having a base 14 and cap portion 16. Cap 16 and base portion 14 may both be made of silicon. Cap 16 covers IR sensor 18 forming space or volume 20; volume 20 within cap 16 may be e.g. an air space or a vacuum. Silicon die 12 is mounted in a mold compound 22, such as Sumitomo G770, which also contains copper alloy component leads 24 and 26, interconnected with die 14 by means of gold bond wires 28 and 30. Silicon die 12 is placed on a lead frame paddle 34, typically fabricated from a copper alloy, which may be a prior art paddle. That paddle incorporates the control aperture 36. Initially such a paddle functions to support the silicon but here it does double service as the aperture layer. The aperture 36 in aperture layer 34 is aligned with and on the other side of die 14 from sensor 18. Aperture layer or paddle 34 may be bonded to silicon die 12 by means of an adhesive 38 such as Ablestik 8290. There may be etched silicon focusing elements 40 on die 12 within aperture 36. For an even more accurate aperture placement, a metalized layer 42 may be employed between die 12 and aperture layer 34. The metalized layer 42 will also be IR opaque as is the aperture layer 34 but in this case the aperture 44 in it may be more precisely deposited on the silicon 14, and etched for more accurate alignment with the sensor 18. The invention can be employed in any exposed paddle lead frame package and provides the added benefit of some protection against handling damage for the etched focusing features 40 on the exposed silicon die 12. The etched silicon focusing elements are explained in greater detail in U.S. patent application Ser. No. 11/045,910, filed Jan. 26, 2005 entitled SENSOR AND CAP ARRANGEMENT, incorporated in its entirety herein by this reference.

In the following FIGS. 2-6 similar parts have been given like numbers accompanied by a lower case letter.

Figure 2:
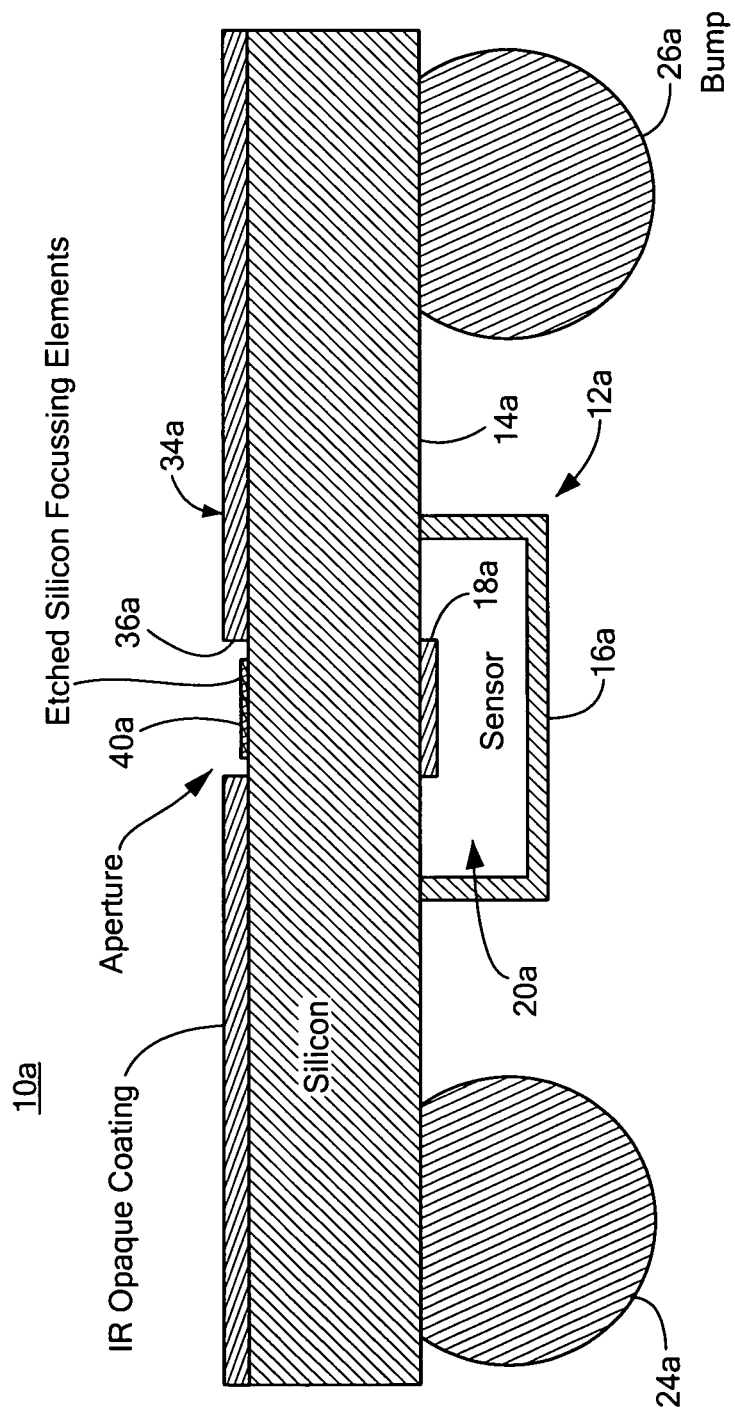
FIG. 2 is a schematic side sectional view of the control aperture for an IR sensor according to this invention on a bumped part with the aperture and sensor on opposite sides.
Figure 3:
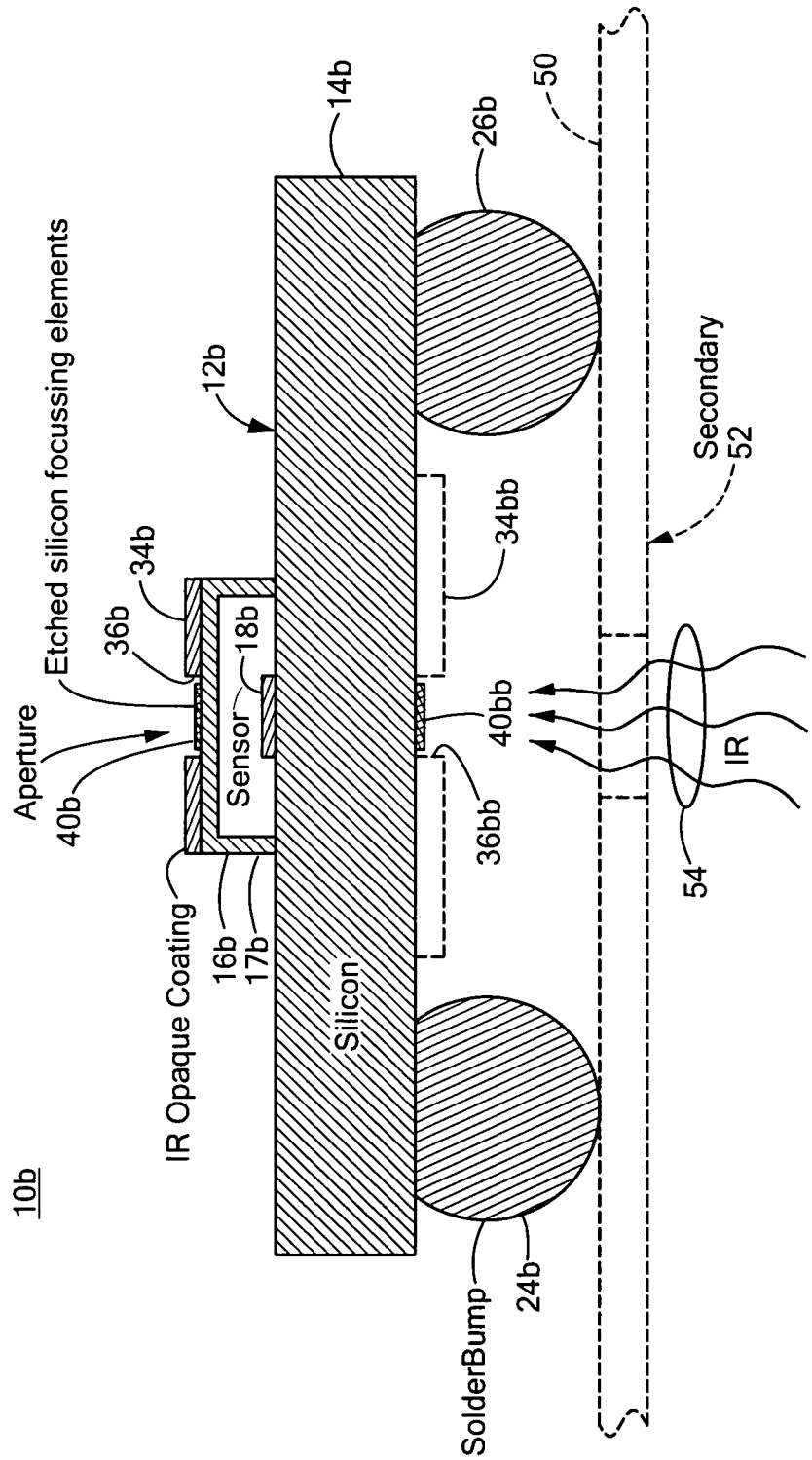
FIG. 3 is a schematic side sectional view of the control aperture for an IR sensor according to this invention on a bumped part with the aperture and sensor on the same side.

A control aperture for an IR sensor on a bump part 10a, FIG. 2, uses aperture layer 34a, typically 5-25 microns thick which can be made of a filled organic polymer or could also be a metalized, typically sputtered, layer. As usual the aperture layer is IR opaque and contains an aperture 36a, which is aligned with sensor 18a on the other side of die 12a on the die base 14a covered by die cap 16a. In aperture 36a again there may etched silicon focusing elements 40a. Solder bumps 24a, 26a may be mechanically and electrically connected to die base 14a. This makes a smaller, lighter and less expensive package and can be accomplished with any bumped die part by coating the back of the wafer and creating the required aperture by exposing/etching/rinsing in the usual way. An added benefit here again is that the coating provides some protection against handling damage for the etched focusing features on the exposed silicon. While the aperture layer and aperture are on one side of die 12a and the IR sensor 18a is on the other in FIG. 2, this is not a necessary limitation of the invention for as shown in FIG. 3, IR sensor 18b and cap or cover 16b may be on the same side as aperture layer 34b with aperture 36b. Alternatively, FIG. 3, as shown in dashed lines for contrast and clarity, solder bumps 24b and 26b may be mounted on a laminated layer 50, such as a printed circuit board, which is ported 52 to pass IR radiation 54. In this construction the aperture layer 34bb may be placed on the underside of die base 14b providing aperture 36bb in aperture layer 34bb and again there may be etched silicon focusing elements 40bb positioned there aligned with IR sensor 18b and aperture 36bb which is in turn aligned with port 52 in laminated layer 50. In FIG. 3, cap 16b has aperture layer 34b only on top and so the sidewalls 17b may allow some spurious IR radiation to reach sensor 18b. Coating processes such as dispensed coatings can deal with this if required.

Figure 4:
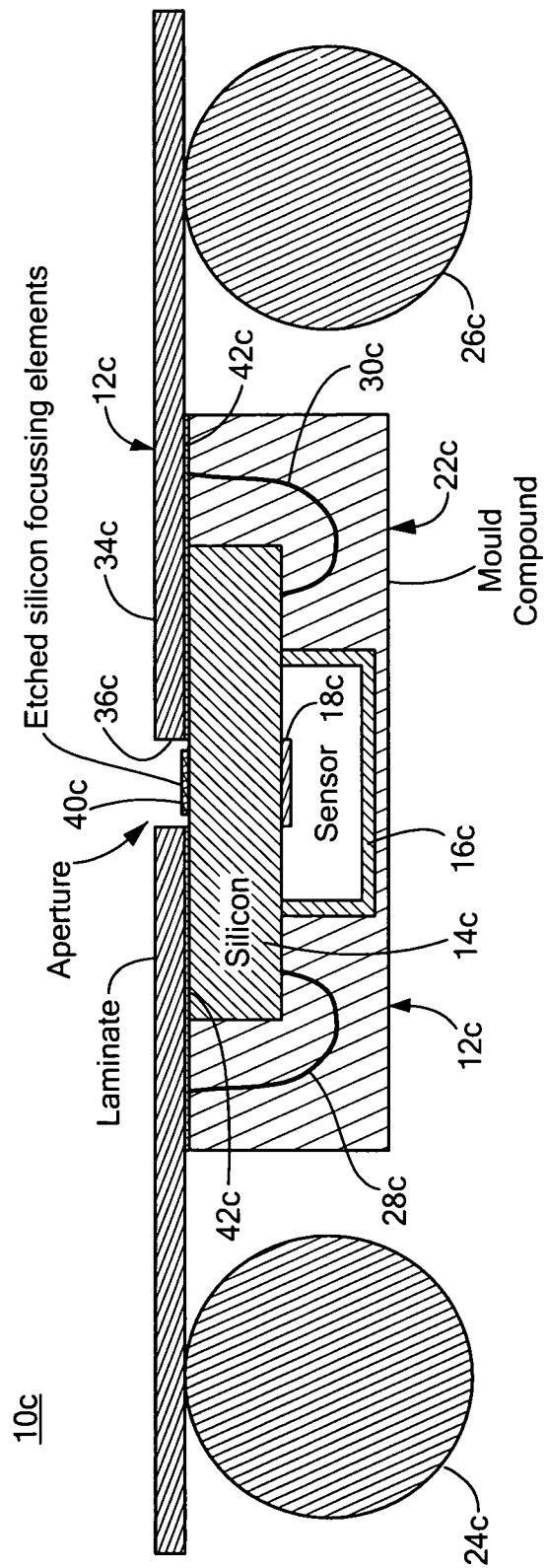
FIG. 4 is a schematic side sectional view of the control aperture for an IR sensor according to this invention on a bumped part with the aperture and sensor in a laminate package, and the aperture defined by the laminate.
Figure 5:
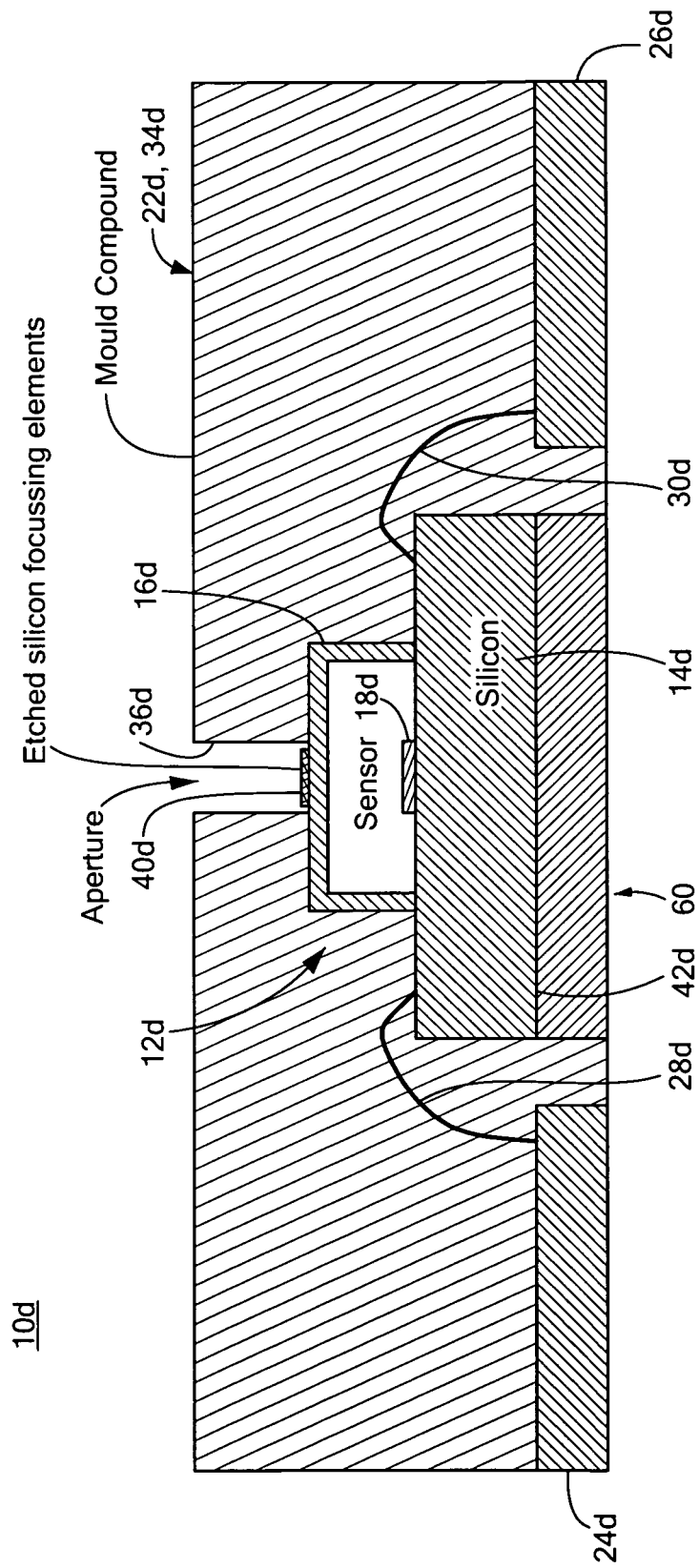
FIG. 5 is a schematic side sectional view of the control aperture for a plastic IR sensor using the mold compound as the control aperture.

A control aperture for an IR sensor according to this invention may be used in a laminate package, 10c, FIG. 4, where the aperture layer 34c may actually be a laminate board with conductor layers having an aperture 36c aligned with sensor 18c on the other side of die 12c covered by cap 16c. The die as well as gold wire bonds 28c and 30c are contained in a molded body 22c typically using the type of mold compound as cited before, e.g. Sumitomo G770. Silicon 14c may be adhered to the laminate aperture layer 34c by an adhesive 42c such as Ablestik 8290. The control aperture for an IR sensor of this invention may also be practiced in a plastic package 10d, FIG. 5, in which the mold compound 22d also functions as the aperture layer 34d containing aperture 36d. Also disposed with mold 22d there may be a copper lead frame 60 which includes copper alloy component leads 24d, 26d. Silicon die 12d may be bonded to lead frame 60 by adhesive 42d, such as Ablestik 8290.

Figure 6:
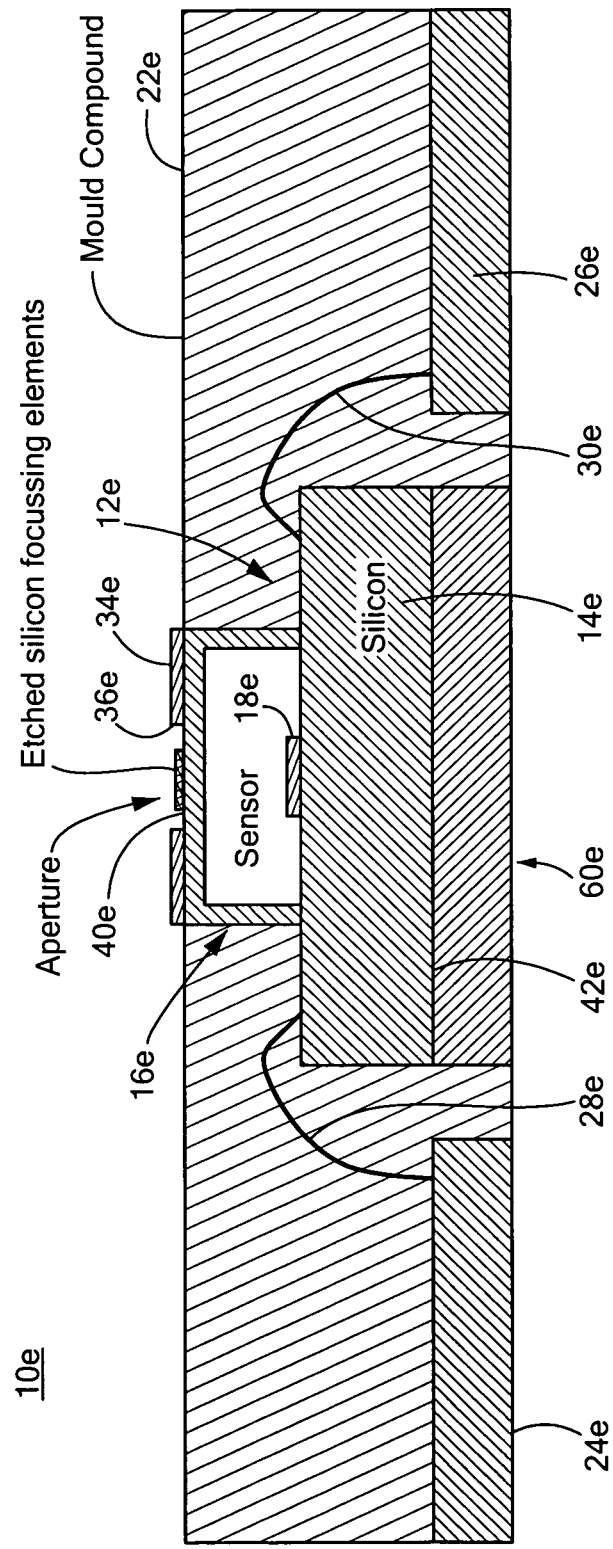
FIG. 6 is a schematic side sectional view of the control aperture for a plastic IR sensor using a separate layer as the control aperture.

Alternatively, as shown in FIG. 6, plastic package 10e may be made with the mold 22e reduced to be more or less flush with the top of cap 16e so that an aperture layer 34e such as a metalized layer or a polymer is used having its own aperture 36e. These approaches can be accomplished in any plastic package by pre-coating the wafer cap with an opaque layer, for example sputtered metal, and then etching the aperture 36e.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. An IR sensor apparatus comprising:
   a die having a first side and a second side;
   an IR sensor disposed on the first side of the die;
   a cap having a top surface disposed on the first side of the die, the cap and die forming a void and covering the IR sensor; and
   an IR opaque aperture layer on the top surface of the cap, the IR opaque aperture layer having an IR transmissive aperture aligned with said IR sensor for controlling the field of view of said IR sensor; wherein the die is disposed in a mold compound flush with the top surface of the cap, such that the aperture layer stands in relief of the top surface of the mold compound.

2. The IR sensor apparatus of claim 1 in which the second side of the die is supported by a lead frame.

3. The IR sensor apparatus of claim 2 wherein the mold compound exposes at least a portion of the cap.

* * * * *